(12) United States Patent
Tsumura (10) Patent No.: US 7,826,270 B2
(45) Date of Patent: Nov. 2, 2010

(54) NON-VOLATILE SEMICONDUCTOR MEMORY DEVICE AND METHOD OF WRITING AND READING THE SAME

(75) Inventor: Kazuhiro Tsumura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 167 days.

(21) Appl. No.: 12/329,164

(22) Filed: Dec. 5, 2008

(65) Prior Publication Data
US 2009/0175085 A1    Jul. 9, 2009

(30) Foreign Application Priority Data
Dec. 12, 2007    (JP)  ............... 2007-320974

(51) Int. Cl.
    *G11C 11/34*    (2006.01)
(52) U.S. Cl. .............. 365/185.18; 365/185.24
(58) Field of Classification Search ............ 365/185.18, 365/185.24
    See application file for complete search history.

(56) References Cited

U.S. PATENT DOCUMENTS

| 7,088,620 | B2 * | 8/2006 | Kawai et al. ............ 365/185.18 |
| 7,180,796 | B2 * | 2/2007 | Tanzawa et al. ......... 365/189.09 |
| 7,212,443 | B2 * | 5/2007 | Furuyama .............. 365/185.18 |
| 7,688,631 | B2 * | 3/2010 | Kim et al. .............. 365/185.18 |

FOREIGN PATENT DOCUMENTS

| JP | 6-139778 A | 5/1994 |
| JP | 10-189918 A | 7/1998 |

* cited by examiner

*Primary Examiner*—Michael T Tran
(74) *Attorney, Agent, or Firm*—Brinks Hofer Gilson & Lione

(57) ABSTRACT

MOS transistors each having different ON withstanding voltages that are drain withstanding voltages when gates thereof are turned on are formed on the same substrate. One of the MOS transistors having the lower ON withstand voltage is used as a memory element. Using the fact that the drain withstanding voltage is low when a gate thereof is turned on, a short-circuit occurs in a PN junction between a drain and the substrate of the one of the MOS transistors having the lower ON withstand voltage to write data.

9 Claims, 5 Drawing Sheets

NON-VOLATILE SEMICONDUCTOR MEMORY DEVICE AND METHOD OF WRITING AND READING THE SAME

RELATED APPLICATIONS

This application claims priority under 35 U.S.C. §119 to Japanese Patent Application No. JP2007-320974 filed on Dec. 12, 2007, the entire content of which is hereby incorporated by reference.

BACKGROUND OF THE INVENTION

1. Field of the Invention

The present invention relates to a nonvolatile semiconductor memory device using a MOS transistor.

2. Description of the Related Art

In a semiconductor memory device which employs an FN tunnel current for injecting charge into a floating gate, application of an electric field of approximately 10 Mv/cm to a gate insulating film is needed to induce the FN tunnel current flow. Further, the electric field that is actually needed becomes approximately 12 MV/cm to control the potential of the floating gate from the potential of the control gate. As to a MOS transistor used in an ordinary circuit, the electric field that may be applied to the gate insulating film is at most between 4 and 6 MV/cm for insuring a typical life time of ten years. Accordingly, formation of a special gate insulating film, which is distinct from a gate insulating film used in other elements and which is able to withstand the strong electric field, is required as a gate insulating film in which the FN tunnel current flows. Consequently, there is a problem of increase in the number of manufacturing steps. For that reason, the nonvolatile memory device employing the FN tunnel current is often sold in the form of a single nonvolatile memory device on the market.

Other than above, there is provided a memory device in which a hot carrier of the MOS transistor is utilized for injecting the charge into the floating gate so that data can be kept by shifting the Vth. This memory device is used for trimming in many cases since the memory device does not need special manufacturing steps used in the nonvolatile semiconductor memory device device is used for a trimming of an LCD driver IC, a power supply IC and the like. It is because the nonvolatile semiconductor memory device, which uses the hot carrier, can be formed on the same chip without any additional steps in the manufacturing steps for those products.

If an NMOS, which has a relatively large impact ionization ratio, is used, the Vth of the NMOS transistor in which no charge is injected into the floating gate, i.e., writing is not made is depletion and is normally on. In contrast, when the charge is injected into the floating gate, i.e., writing id made, the Vth becomes enhancement, i.e., normally off. In the reading operation, in which the control gate is set low while a voltage is applied between the drain and the source, current does not flow between the drain and the source in the NMOS transistor that is written while current flows between the drain and the source in the NMOS transistor that is not written. The current flow between the drain and the source causes the generation of the hot carrier, and a part of the hot carrier is injected into the floating gate though the injection is extremely little. In other words, the reading operation advances the writing as time passes. In order to solve this problem, various structures have been made (see, for example, Japanese Patent Application Laid-open JP 10-189918).

Other than the memory device described above there is proposed a memory device in which a voltage higher than or equal to the junction withstanding voltage is applied to the diode to short-circuit the junction for writing. Since application of the same voltage in the reading operation as that in the writing operation short-circuits the junction so that the writing is made in this method, the reading voltage is suppressed to be low. Alternatively, it is necessary to perform the writing by applying a voltage higher than or equal to the maximum operating voltage. In addition, it is difficult to form the diode having the withstanding voltage satisfying the above-mentioned condition on the same substrate without adding a manufacturing step in many cases (see Japanese Patent Application Laid-open JP 6-139778).

There are various means taken for avoiding the injection of charge into the floating gate during the reading operation in a semiconductor memory device that utilizes the hot carrier in writing. For instance, a lightly doped drain (LDD) structure is used to relax the electric field in the vicinity of the drain so as to suppress the hot carrier in the reading operation. This countermeasure reduces injection of the charge into the floating gate, but can not be an essential solution. There is taken another countermeasure in which the drain voltage for reading is restricted to a voltage lower than that for writing so as to avoid an erroneous writing because continuous application of the same voltage for reading as that for writing causes erroneous writing in a MOS transistor that is not written. Further, there is the case where data is acquired at the turning-on of the power so as to reduce time duration for applying the voltage for reading, and the data is stored in the SRAM so that the voltage is applied only at the turning-on of the power. Such a countermeasure has a problem that the operating voltage range becomes narrow or that the area of the chip increases because of the additional circuit.

In addition, in the semiconductor memory device using a short-circuit in the junction of the diode the suppression of the reading voltage to be low or the application of a voltage higher than or equal to the maximum operating voltage for writing is needed because the application of the same voltage in reading as that in writing causes the short-circuit in the junction by which writing occurs.

For the reason described above, a memory device has been demanded, in which writing is performed by a voltage within the maximum operating voltage that is determined by the MOS transistor other than the memory element, and data inversion does not occur even if the maximum operating voltage determined by the MOS transistor other than the memory element is applied continuously for a desired period of time, e.g., ten years typically. In addition, a method of manufacturing such a memory device has been demanded, which does not need additional steps and may be realized at low cost.

SUMMARY OF THE INVENTION

In order to solve the problems described above, the present invention proposes the following means. A nonvolatile semiconductor memory device includes MOS transistors each having different ON withstanding voltages formed on the same substrate. One of the MOS transistors having the lower ON withstanding voltage is used as a memory element in which a low drain withstanding voltage during turning-on of a gate is used to cause a short-circuit in a PN junction between a drain and the substrate of the one of the MOS transistors having the lower ON withstanding voltage so as to conduct data writing.

In the memory device according to the present invention, data can be written by a voltage within the maximum operating voltage determined by the MOS transistor other than the memory element, and data inversion does not occur even if the maximum operating voltage determined by the MOS transistor other than the memory element is applied continuously for ten years. In addition, it is possible to form the memory device according to the present invention on the same substrate without adding any step to the steps for manufacturing the MOS transistor other than the memory element.

DETAILED DESCRIPTION OF THE PREFERRED EMBODIMENTS

Hereinafter, best embodiments of the present invention are described.

First Embodiment

Figure 1A:
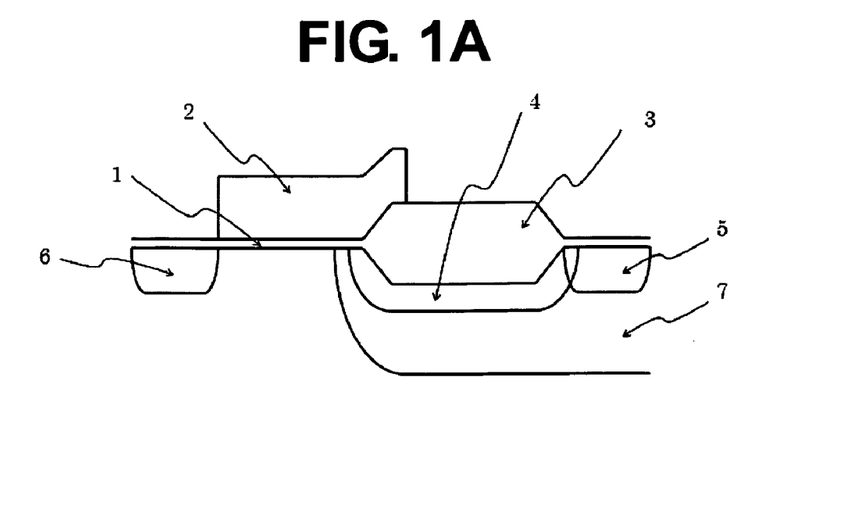
FIGS. 1A and 1B illustrate a plan view and a cross section of a high ON withstanding voltage NMOS transistor that is used for a first embodiment of the present invention.
Figure 1B:
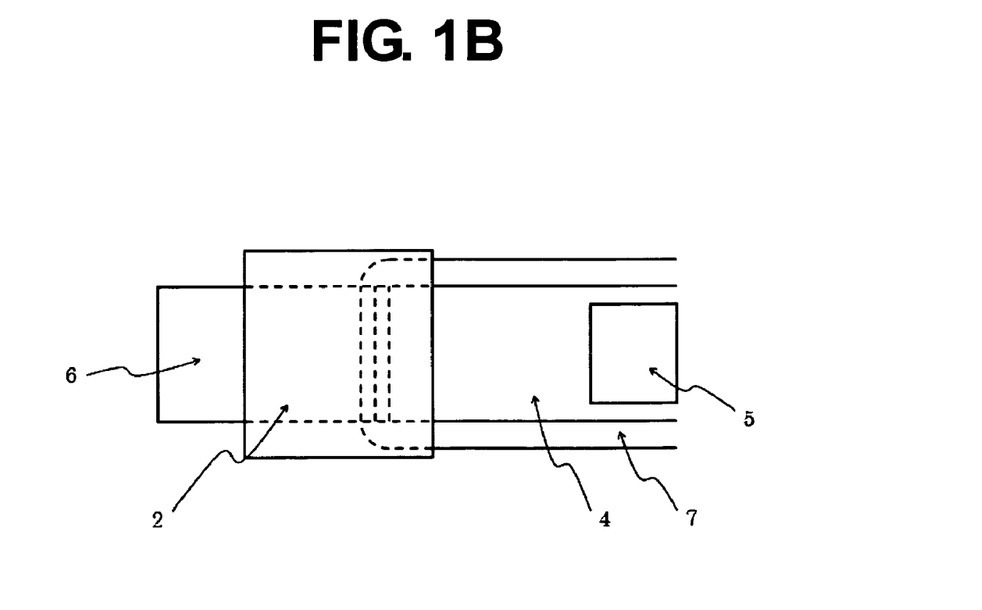

As illustrated in FIGS. 1A and 1B, on a P-type silicon substrate, a LOCOS offset drain type NMOS transistor is formed in which an N well region 7 is disposed in a drain region. In this transistor, the length of a LOCOS 3 determines the length of an N− low concentration drain region 4 that is an offset region under the LOCOS 3. An end of the N− low concentration drain region 4 is connected to an N+ drain region 5 for electric connection with another element or the like, and the other end thereof is provided with a gate electrode 2 in such a manner that a part of the gate electrode goes aground on the LOCOS 3 via a gate insulating film 1. An N+ source region 6 is disposed on the opposite side to the N+ drain region 5 with respect to the gate electrode 2. Here, concentrations of impurities in the N type region are set as follows. The concentration in the N well region 7 is lowest, the concentrations in the N+ drain region 5 and N+ source region 6 are highest, and the concentration in the N− low concentration drain region 4 is medium therebetween. This NMOS transistor has an ON withstanding voltage that is higher than that of the NMOS transistor illustrated in FIGS. 2A and 2B that is described below. The "ON withstanding voltage" means a drain voltage at which current flowing in the drain increases rapidly from the channel current at the condition where a voltage of Vth or higher is applied to the gate electrode 2 of the NMOS transistor to cause inversion, i.e., turning on, of the channel. This current increase is normally called first breakdown.

Figure 2A:
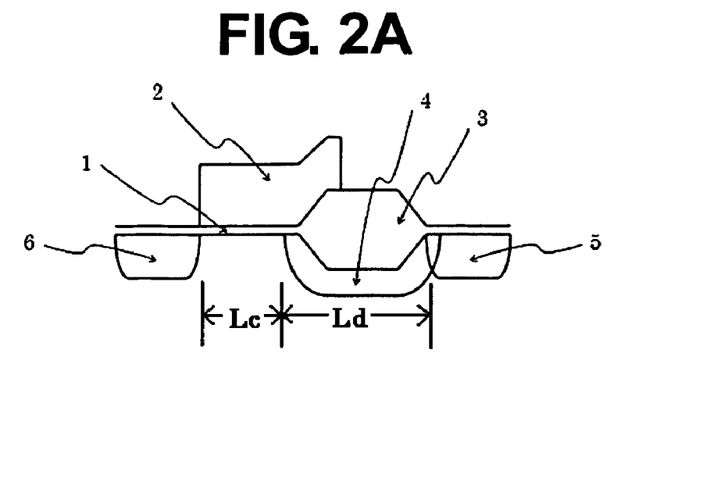
FIGS. 2A and 2B illustrate a plan view and a cross section of a low ON withstanding voltage NMOS transistor that is used for the first embodiment of the present invention.
Figure 2B:
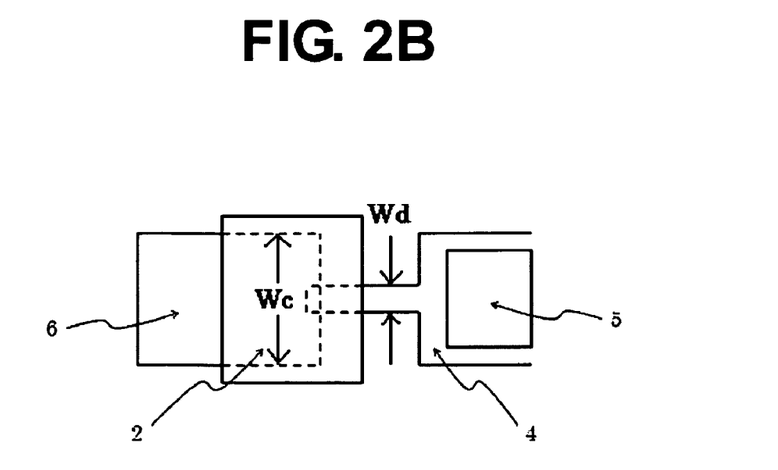

Further, as illustrated in FIGS. 2A and 2B, a LOCOS offset drain NMOS transistor in which the N-well is not disposed in the drain region is formed on the P-type silicon substrate. A LOCOS offset length Ld that is a length of the N− low concentration drain region 4 of the NMOS transistor is set to a value smaller than that of the transistor illustrated in FIGS. 1A and 1B. In addition, a LOCOS offset width Wd that is a length in the channel width direction of the N− low concentration drain region 4 is set to a value smaller than a channel width Wc. The off current between the drain and the source is smaller compared with the NMOS transistor illustrated in FIGS. 1A and 1B because the N-well is not disposed in the drain region. Accordingly, a channel length Lc may be shorter compared with the NMOS transistor illustrated in FIGS. 1A and 1B. The NMOS transistor illustrated in FIGS. 2A and 2B that is manufactured as described above has the ON withstanding voltage that is lower than that of the NMOS transistor illustrated in FIGS. 1A and 1B. Hereinafter, the transistor illustrated in FIGS. 1A and 1B having the higher ON withstanding voltage is referred to as high ON withstanding voltage NMOS transistor while the transistor illustrated in FIGS. 2A and 2B having the lower withstanding voltage is referred to as low ON withstanding voltage NMOS transistor. The low ON withstanding voltage NMOS transistor illustrated in FIGS. 2A and 2B has a different structure and different sizes from those of the high ON withstanding voltage NMOS transistor illustrated in FIGS. 1A and 1B, but the both may be formed on the same substrate without any additional manufacturing steps. The LOCOS offset drain NMOS transistor is described above as an example illustrating the structure of the two types of transistors each having different ON withstanding voltages, but the scope of the invention is not limited to this structure.

Figure 3:
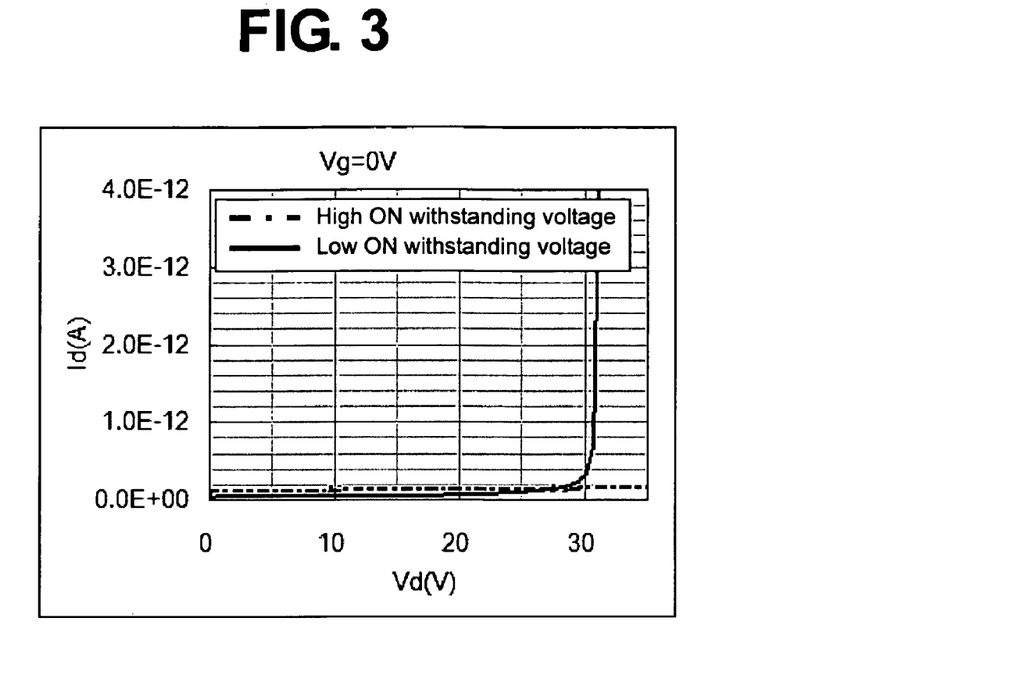
FIG. 3 is a graph illustrating a relationship between drain current and drain voltage when Vg is zero volts.
Figure 4:
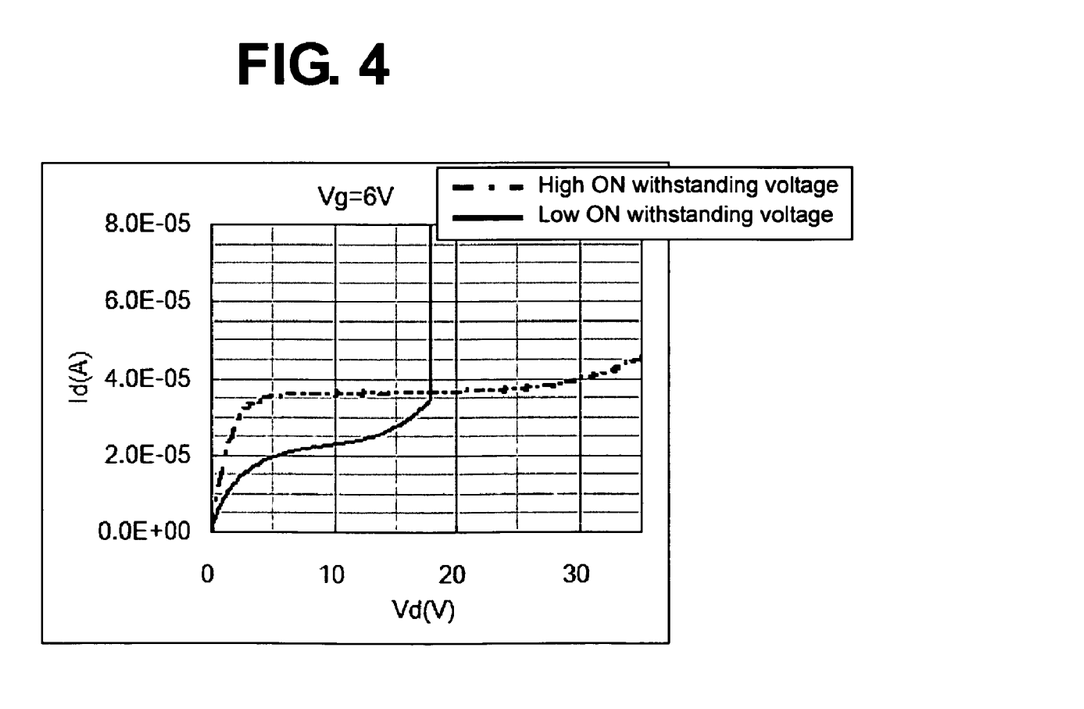
FIG. 4 is a graph illustrating a relationship between drain current and drain voltage when Vg is 6 volts.

The relationships between the drain current and the drain voltage in the two types of NMOS transistors described above are illustrated in FIGS. 3 and 4. In each figure, the horizontal axis is the drain voltage while the vertical axis is the drain current. A solid line indicates characteristics of the low ON withstanding voltage NMOS transistor while a dashed dotted line indicates characteristics of the high ON withstanding voltage NMOS transistor. FIG. 3 illustrates a relationship between drain current and drain voltage when the gate is turned off. FIG. 4 illustrates a relationship between drain current and drain voltage when the gate is turned on. It is understood that the low ON withstanding voltage NMOS transistor has a drain withstanding voltage when the gate is turned on (ON withstanding voltage) that is approximately 15 volts and is only a half of approximately 30 volts of the drain withstanding voltage when the gate is turned off.

In addition, as to the low ON withstanding voltage NMOS transistor, since the drain current at the first breakdown when the drain current begins to increase is almost the same as the drain current at the second breakdown when the drain current increases rapidly, the second breakdown follows the occurrence of the first breakdown so that the MOS transistor breaks down completely resulting in a short-circuit of the PN junction between the drain and the substrate. It is assumed that this phenomenon is caused by concentration of energy in the N− low concentration drain region and a small volume of the N− low concentration drain region that allows heat to go up easily.

Figure 5:
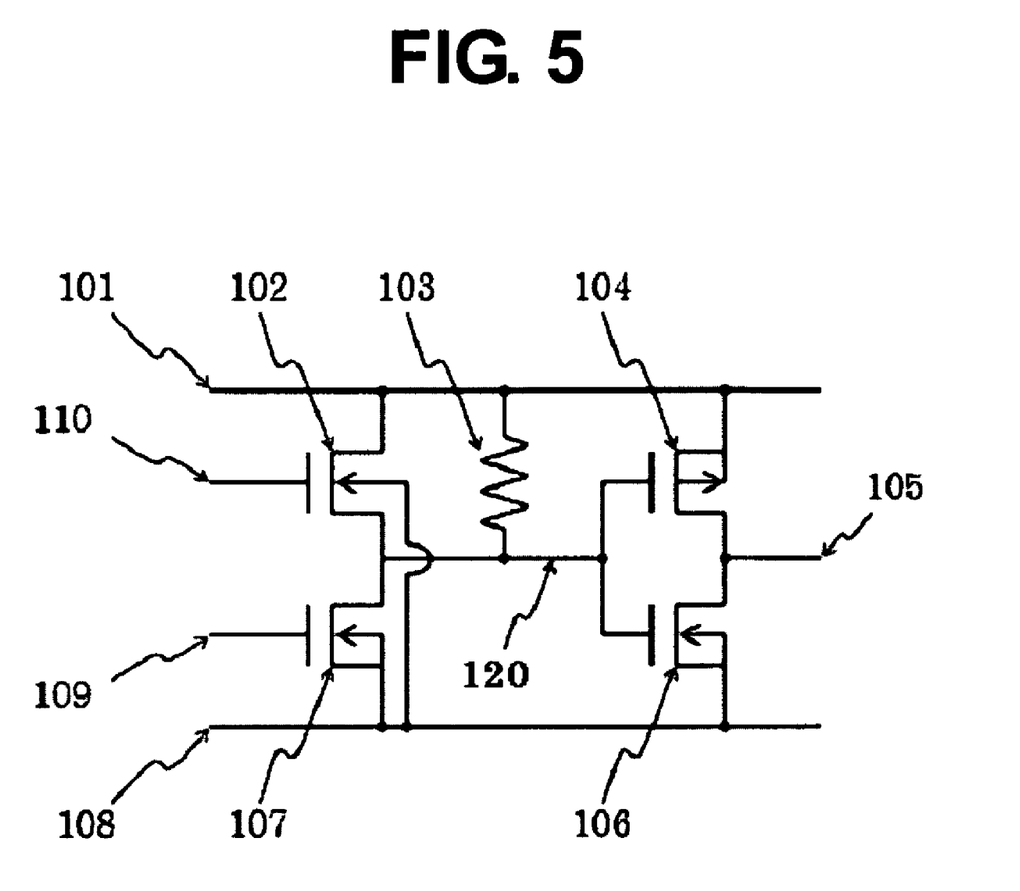
FIG. 5 is a circuit diagram illustrating the first embodiment of the present invention.

A circuit illustrated in FIG. 5 is constituted by using the two types of NMOS transistors. A low ON withstanding voltage NMOS transistor 107 plays a role of the memory element. A high ON withstanding voltage NMOS transistor 102 plays a role of a switch between the drain of the memory element and the power supply voltage. Writing is performed by making a power supply line 101 be a voltage that is higher than the drain withstanding voltage when the gate of the low ON withstanding voltage NMOS transistor 107 is turned on and is lower than the drain withstanding voltage when the gate is turned off while both input terminals 109 and 110 are high. Current flows between the power supply and the ground after tuning-on of the transistors 102 and 107. The transistor 107 has a low ON withstanding voltage, and hence the transistor 107 breaks down completely by this current so that short-circuit occurs in the junction between the drain and the substrate. In contrast, the transistor 102 does not break down because the transistor 102 has a high ON withstanding voltage.

Reading is performed while both the input terminals 109 and 110 are low. If the writing is performed, a potential of a node 120 is close to the ground level because the drain of the transistor 107 is short-circuited to the substrate. When this potential is supplied to an inverter including a PMOS transistor 104 and an NMOS transistor 106, a potential that is shaped to be the power supply level is delivered from an output terminal 105. In contrast, if the writing is not performed, the potential of the node 120 becomes substantially the power supply level via a high resistance element 103 because the resistance between the drain and the substrate is extremely high. When this potential is supplied to the inverter including the transistors 104 and 106, a potential that is shaped to be the ground level is delivered from the output terminal 105. The fact that the potential of the node 120 is substantially the power supply level means that the voltage that is substantially the same as the power supply voltage is applied to the drain of the low ON withstanding voltage NMOS transistor 107 that works as the memory element. The gate potential of the low ON withstanding voltage NMOS transistor 107 is low level, and the drain withstanding voltage of the low ON withstanding voltage NMOS transistor 107 is higher than the maximum operating voltage. Accordingly, an erroneous writing does not occur even if the voltage is continuously applied for ten years.

The current that flows at reading of a written element is substantially the same as the current that flows when the power supply voltage is applied to the high resistance element 103, because the transistor 102 is turned off and the drain of the transistor 107 is short-circuited to the substrate. The value thereof is 2 nA when the power supply voltage is 20 volt and resistance of the high resistance element 103 is $1 \times 10^{10}$ ohm. The current that flows when an unwritten element is read is only leak current because the transistor 107 is turned off. A resistance value of the high resistance element 103 should be set in accordance with permissible current consumption or desired response speed within the range maintaining the current flow larger than or equal to the off current of the transistor 107.

As described above, the NMOS transistor that has a low ON withstanding voltage and may be broken down completely by causing the second breakdown at substantially the same time as the first breakdown may be formed on the same substrate without an additional step by considering a structure and a size of the drain region. A write-once nonvolatile semiconductor memory device can be manufactured by using the difference between the ON withstanding voltages of the NMOS transistors.

The case where the NMOS transistor is formed directly on the P-type silicon substrate is described above. If the well is formed on the silicon substrate and the MOS transistor is formed in the same, the well works as the substrate. Accordingly, in this case, the above-mentioned junction between the drain and the substrate corresponds to a junction between the drain and the well. In addition, the MOS transistor is described above, but the gate insulating film is not limited to a silicon oxide film. The embodiment of the present invention is described above in detail with reference to the drawings, but the concrete structure thereof is not limited to the embodiment described above. For instance, it is possible to set two or more concentration values in the low concentration drain region so that a difference between the concentration values is used for forming the MOS transistors each having different ON withstanding voltages on the same substrate. In addition, it is possible to set two or more depth values in the low concentration drain region so that a difference between the depth values is used for forming the MOS transistors each having different ON withstanding voltages on the same substrate.

In the case of the present invention, it is advantageous that an ultraviolet irradiation step is not necessary before the writing operation though the ultraviolet irradiation step is necessary for the conventional write-once memory device which uses a floating gate. In addition, the writing is not performed even if the voltage to be applied to the memory element is increased up to the drain withstanding voltage when the gate is turned off. Accordingly, it is advantageous that a reading condition is wider compared with the conventional floating gate type memory device. In addition, the floating gate type has a problem that a test for confirming reliability in long term is burdensome because data retention proceeds gradually as time passes. The present invention, however, does not have such a problem because every potential is fixed.

As to the breaking type that is the same as the present invention, there is a type breaking the gate insulating film. In the case of the insulating film leakage, auto-repair occurs due to heat of leakage current. There is the case where insulation property is repaired though it is rare, and hence data inversion becomes a problem. It is a merit of the present invention that the data inversion due to such auto-repair is not recognized.

In addition, as to the breaking type that is the same as the present invention, there is a type that performs the writing by breaking the junction by applying a reverse voltage higher than or equal to the junction withstanding voltage to the diode. In the case of this type, if a voltage that is the same as the voltage for writing is applied for reading, the junction breaks so that the writing is performed. Accordingly, the voltage to be applied for reading is limited to a voltage that is much lower than the voltage for writing. In addition, it is necessary to realize the junction withstanding voltage that is lower than or equal to a withstanding voltage of the transistor constituting the circuit, but it is difficult to realize the junction withstanding voltage without an additional step. However, the present invention does not have such a problem.

The present invention is suitable for a use of trimming of a semiconductor circuit having another main function rather than a use as a single memory device having a large capacity. As a recent example, there is a semiconductor circuit in which an LCD driver IC or the like needs the trimming. In the case of the trimming use, it is desired to provide a method of adding a memory device without adding any step to manufacturing steps for the circuit having the main function. In addition, not so many bits are required, and hence a major portion of the area of the memory circuit in the trimming use is occupied by not the memory element but a peripheral circuit. Accordingly, a size of the peripheral circuit is more important than a size of the memory element. In this case, if the memory element may be written by a lower voltage and may keep the data even if a higher voltage is continuously applied for a longer period of time, the size of the peripheral circuit may be easily reduced. The present invention provides the semiconductor memory device that is suitable for this condition.

Second Embodiment

The maximum operating voltage of a circuit is + determined by a junction withstanding voltage, a parasitic channel withstanding voltage, characteristics of the gate insulating film and the like. Among these factors, the characteristics of the gate insulating film are deteriorated as time passes. The maximum operating voltage is determined so that the deterioration of the characteristics of the gate insulating film is within a tolerance even if the voltage is continuously applied for the desired life, which is usually ten years. This voltage is referred to as normal maximum operating voltage for convenience sake.

The writing time for the memory element is much shorter than ten years. The writing time is approximately one second at most. Accordingly, if there is a margin in the element other than the gate insulating film, for instance, a margin in the junction withstanding voltage or the parasitic channel withstanding voltage, it is possible to set a high value of the maximum operating voltage that is used only for the writing operation. For instance, even if deterioration corresponding to ten days occurs in the gate insulating film in the normal use under the condition of the write time of one second, the deterioration is not a particular problem considering the life of ten years. In other words, the maximum operating voltage in the writing operation may be increased up to a range that does not cause a problem for the long term reliability. This voltage is referred to as write-limited maximum operating voltage for convenience sake.

If it is difficult to reduce the ON withstanding voltage to the normal maximum operating voltage or lower, the writing operation may be performed by applying the maximum operating voltage that is used only for the writing operation.

In the case of the conventional method in which the writing operation is performed by breaking the junction by applying the reverse voltage higher than or equal to the junction withstanding voltage to the diode, it is possible to obtain the effect that no erroneous writing occurs even if the normal maximum operating voltage is applied continuously for reading if the diode may be formed, which has the junction withstanding voltage higher than the normal maximum operating voltage and lower than the maximum operating voltage that is used only for the writing operation. However, it is difficult to form the diode having this junction withstanding voltage on the same substrate without an additional step. In contrast, the present invention may be realized without an additional step.

Third Embodiment

A switch is provided between the source of the low ON withstanding voltage MOS transistor serving as the memory element and the ground, and this switch is turned off for reading operation. In this case, the gate potential of the low ON withstanding voltage MOS transistor serving as the memory element may be on or off. This means that the role of the gate of the low ON withstanding voltage transistor is effectively imposed on the other switch.

Fourth Embodiment

Figure 6:
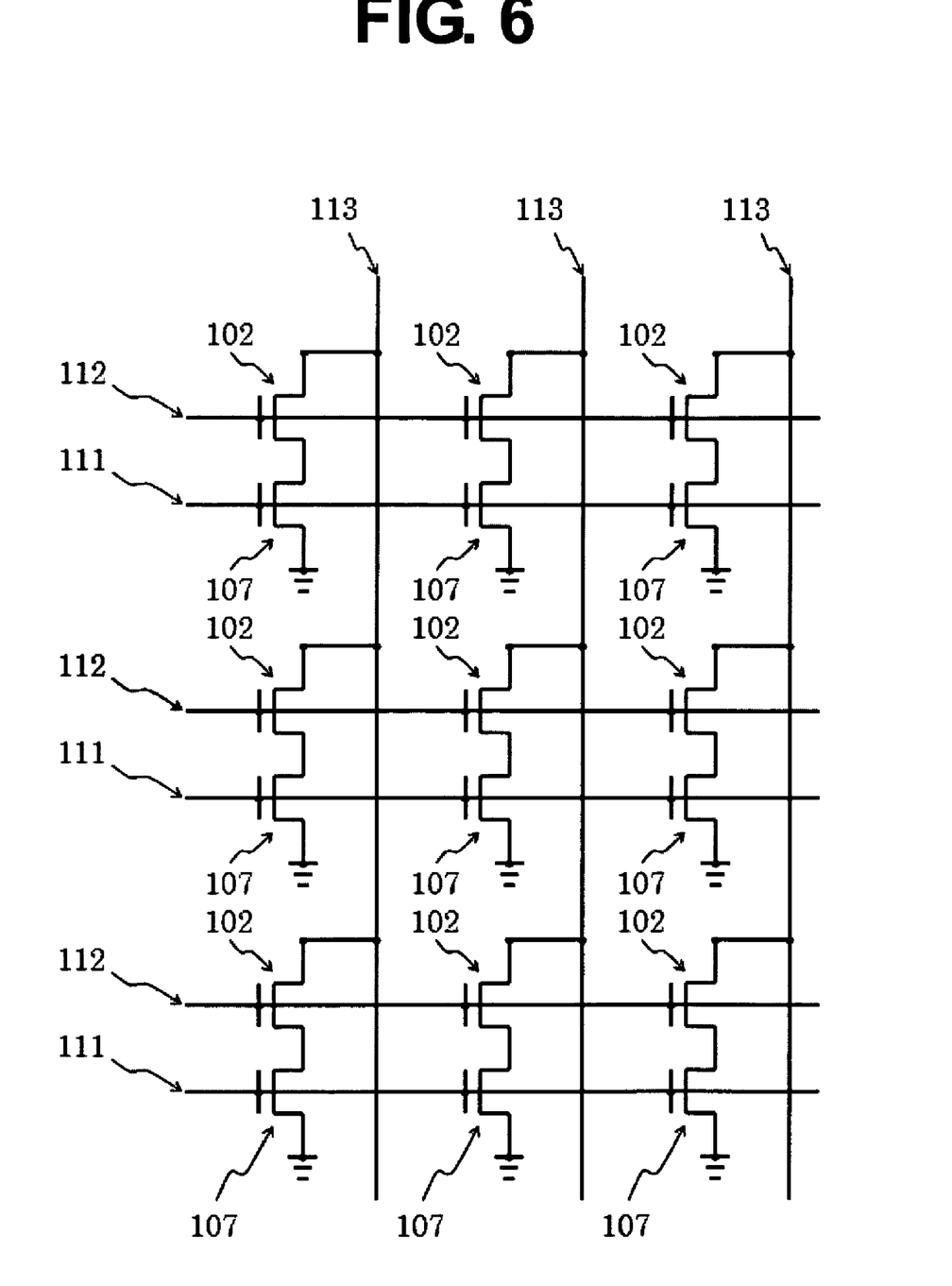
FIG. 6 is a circuit diagram illustrating a fourth embodiment of the present invention.

If the number of bits of the memory device is large, the memory elements are arranged in grid, and memory element word lines 111 connected to the gates of the memory elements, i.e., the low ON withstanding voltage NMOS transistors, selection transistor word lines 112 connected to the gates of the high ON withstanding voltage NMOS transistors and bit lines 113 are wired as illustrated in FIG. 6. The writing operation is performed only in the elements in which the memory element word lines 111, the selection transistor word lines 112 and the bit lines 113 are all high level. The reading operation is performed in the state where all the memory element word lines 111 are low level. When a high level voltage is applied to the selection transistor word line 112 to be read and the reading voltage is applied to the bit line 113, the reading voltage is delivered as it is from the element that is not written while a low level voltage is delivered from the element that is written. Such a structure is applied also to a memory device of many bits and relatively large capacity in which the memory elements are arranged in grid.

What is claimed is:

1. A nonvolatile semiconductor memory device, comprising:
   a first MOS transistor used as a memory element and having a low ON withstanding voltage that is a drain withstanding voltage when a gate thereof is turned on; and
   a second MOS transistor having a high ON withstanding voltage, the first MOS transistor and the second MOS transistor being arranged on a same substrate, wherein:
   a first voltage that is higher than or equal to a threshold voltage of the first MOS transistor, and a second voltage that is higher than or equal to the ON withstanding voltage of the first MOS transistor and is lower than or equal to the ON withstanding voltage of the second MOS transistor are applied respectively to a gate electrode and a drain of the first MOS transistor so that a short-circuit occurs in a PN junction between the drain and the substrate of the first MOS transistor to write data; and
   the second voltage is applied to a drain of the second MOS transistor to read the data.

2. A nonvolatile semiconductor memory device according to claim 1, wherein the first MOS transistor and the second MOS transistor each having different ON withstanding voltages are formed on the same substrate by setting at least two concentration values in a low concentration drain region and using a difference between the at least two concentration values.

3. A nonvolatile semiconductor memory device according to claim 1, wherein the first MOS transistor and the second MOS transistor each having different ON withstanding voltages are formed on the same substrate by setting at least two depth values in a low concentration drain region and using a difference between the at least two depth values.

4. A nonvolatile semiconductor memory device according to claim 1, wherein the first MOS transistor and the second MOS transistor each having different ON withstanding voltages are formed on the same substrate by setting at least two width values in a low concentration drain region in terms of a channel width ratio and using a difference between the at least two width values.

5. A nonvolatile semiconductor memory device according to claim 1, wherein the first MOS transistor and the second MOS transistor each having different ON withstanding voltages are formed on the same substrate by setting at least two length values in a low concentration drain region and using a difference between the at least two length values.

6. A nonvolatile semiconductor memory device according to claim 1, wherein the data is read by a gate voltage that turns off the first MOS transistor.

7. A writing method for a nonvolatile semiconductor memory device comprising:
- a first MOS transistor used as a memory element and having a low ON withstanding voltage that is a drain withstanding voltage when a gate thereof is turned on; and
- a second MOS transistor having a high ON withstanding voltage, the first MOS transistor and the second MOS transistor being arranged on a same substrate, the writing method, comprising the steps of:
- applying a first voltage that is higher than or equal to a threshold voltage of the first MOS transistor, and a second voltage that is higher than or equal to the ON withstanding voltage of the first MOS transistor, that is lower than or equal to the ON withstanding voltage of the second MOS transistor, and that is applied to a drain of the second MOS transistor for reading, are applied to the gate electrode and a drain of the first MOS transistor respectively; and
- short-circuiting a PN junction between the drain and the substrate of the first MOS transistor to write data.

8. A reading method for a nonvolatile semiconductor memory device comprising:
- a first MOS transistor used as a memory element and having a low ON withstanding voltage that is a drain withstanding voltage when a gate thereof is turned on; and
- a second MOS transistor having a high ON withstanding voltage, the first MOS transistor and the second MOS transistor being arranged on a same substrate, the reading method, comprising the step of:
- applying, to a drain of the second MOS transistor, a voltage that is higher than or equal to the low ON withstanding voltage of the first MOS transistor, that is lower than or equal to the high ON withstanding voltage of the second MOS transistor, and that is applied to a drain of the first MOS transistor when data is written in the first MOS transistor, to read the data.

9. A reading method for a nonvolatile semiconductor memory device according to claim 8, wherein the data is read by a gate voltage that turns off the first MOS transistor.

* * * * *